(12) United States Patent
Wang et al.

(10) Patent No.: US 6,245,667 B1
(45) Date of Patent: Jun. 12, 2001

(54) METHOD OF FORMING VIA

(75) Inventors: Ling-Sung Wang, Hsinchu; Chingfu Lin, Taipei; Chien-Jung Wang, Hsinchu Hsien, all of (TW)

(73) Assignee: Semiconductor Manufacturing Corp., Hsinchu (TW)

( * ) Notice: Subject to any disclaimer, the term of this patent is extended or adjusted under 35 U.S.C. 154(b) by 0 days.

(21) Appl. No.: 09/465,905

(22) Filed: Dec. 17, 1999

(30) Foreign Application Priority Data

Oct. 18, 1999 (TW) .............................................. 088117958

(51) Int. Cl.[7] .............................................. H01L 21/4763
(52) U.S. Cl. .......................... 438/626; 438/620; 438/627; 438/637; 438/639; 438/629; 257/649; 257/698; 257/750

(58) Field of Search ..................................... 438/620, 626, 438/627, 637, 639, 629; 257/649, 698, 750

(56) References Cited

U.S. PATENT DOCUMENTS 6,054,380 * 4/2000 Naik ..................................... 438/624

* cited by examiner

Primary Examiner—Charles Bowers
Assistant Examiner—Lisa Kilday
(74) Attorney, Agent, or Firm—Jiawei Huang; J.C. Patents

(57) ABSTRACT

A method of forming a via. A stacked structure has a barrier layer and a metal line is formed over a substrate. Spacers capable of serving as a barrier are formed over tapering sidewalls of the stacked structure before vias and plugs are formed.

9 Claims, 2 Drawing Sheets

METHOD OF FORMING VIA

CROSS-REFERENCE TO RELATED APPLICATION

This application claims the priority benefit of Taiwan application serial No. 88117958, filed Oct. 18, 1999.

BACKGROUND OF THE INVENTION

1. Field of the Invention

The present invention relates to a method of forming a via that leads to a semiconductor device. More particularly, the present invention relates to a method of forming a landed via according to the borderless design rule.

2. Description of the Related Art

Before the development of techniques for forming deep sub-micron semiconductor devices, critical dimension (CD) of devices used to be quite large. Even if there is some misalignment in carrying out photolithographic process so that the vias are slightly offset, subsequently formed contacts can still land on the desired metallic lines. Operating characteristics of the device are affected very little by the misalignment.

However, when techniques for fabricating deep sub-micron devices are employed, critical dimensions of devices shrink considerably. Very small misalignment of vias or plugs often can have considerable effect on the operating characteristics of the devices. Alignment of vias and plugs becomes critical especially when the desired dimensions of a device exceed or approach the acceptable tolerance of the fabricating equipment. Hence, the conventional method is incapable of fabricating vias or plugs that land exactly on the desired locations according to deep-submicron device specification.

Therefore, innovative techniques for forming borderless vias or plugs are required in order to fabricate deep submicron devices. In particular, the formation of interconnects between a large number of layers to form a multi-level interconnect (MLM) system depends very much on the capacity to form high-quality borderless vias or plugs.

FIG. 1 is a schematic cross-sectional view of an ideal borderless via structure, and FIG. 2 is a schematic cross-sectional view of an actual borderless via structure illustrating the effect of microloading after a metallic layer is patterned to form a metallic line.

As shown in FIG. 1, the edges of an ideal metal line 102 and its associated barrier layer 104 are almost vertical after patterning. Hence, a subsequently formed via 106 is able to land on the barrier layer 104. When a plug 108 is formed inside the via 106, the plug 108 makes contact with the barrier layer 104 without touching the metallic line 102.

As shown in FIG. 2, due to microloading in the etching operation, a rectangular metallic line 102 and barrier layer 104 profile like the one in FIG. 1 is difficult to obtain. Instead, the patterned metallic line 202 and the barrier layer 204 have a trapezoidal profile. The tapering shape of the trapezoidal structure reduces the surface area at the top of the barrier layer 204. When a borderless via 206 is formed over the barrier layer 204, a portion of the via 206 falls outside the top surface of the barrier layer 204 and the sidewall of the metallic line 202 is exposed. Subsequently, if a plug 208 is formed inside the via 206, the plug 208 not only makes contact with the barrier layer 204, but also makes contact with the metallic line 202.

In general, a titanium silicide (TiN) layer is first deposited over the interior surface of the via 206 before the formation of the plug. The titanium silicide layer is able to strengthen the adhesion of the plug 208. However, if the titanium silicide layer is formed by a nitridation procedure, gaseous nitrogen ($N_2$) may react with the metallic material on the metallic line 202 (usually an aluminum-copper alloy) to form aluminum nitride (AlN). Consequently, resistivity of the plug 208 increases leading to electron migration and reliability problems for the devices.

SUMMARY OF THE INVENTION

The invention provides a method of forming a landed via. The method includes providing a substrate, and then forming a stacked structure comprising a conductive line made from an aluminum-copper alloy and a first barrier layer. The stacked structure has a trapezoidal profile with sloped sides. A second barrier layer is formed over the stacked structure and the substrate. The second barrier layer is etched back to form spacers on the sloped sidewalls of the stacked structure. A dielectric layer is formed over the stacked structure, the spacers and the substrate. A via is formed in the dielectric layer. The via exposes a portion of the first barrier layer and the spacer.

In this invention, spacers capable of serving as a barrier are formed over the tapering sidewalls of the metallic line and the barrier layer before vias and plugs are formed.

Since the tapering sidewalls of the metallic line and the barrier layer are covered by spacers, the vias are isolated from the underlying metallic line and barrier layer. Even if the via is formed according to the borderless design specification and does not land directly on the barrier layer, the via still does not lead directly to the surface of the metal line. Therefore, a subsequently formed plug inside the via has no direct contact with the metal line and cannot result in a higher resistivity and electron migration.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
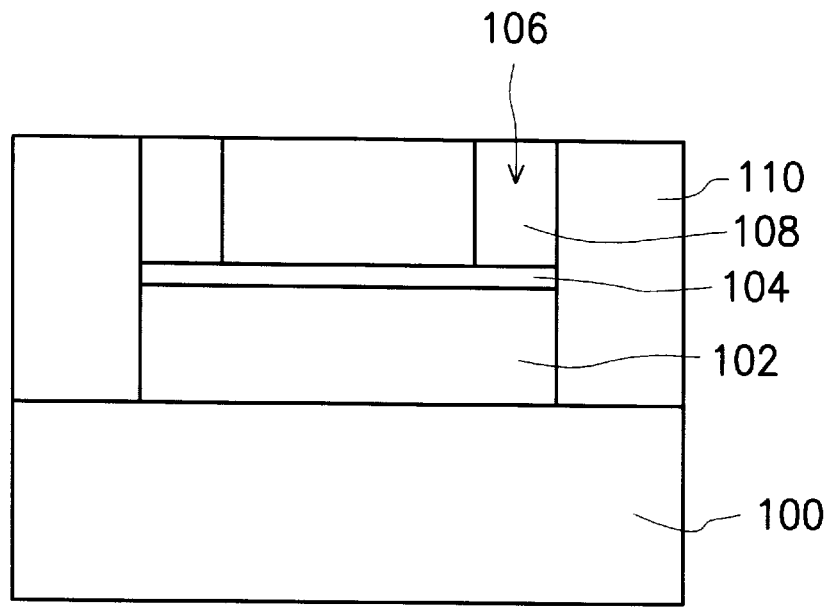
FIG. 1 is a schematic cross-sectional view of an ideal borderless via structure.
Figure 2:
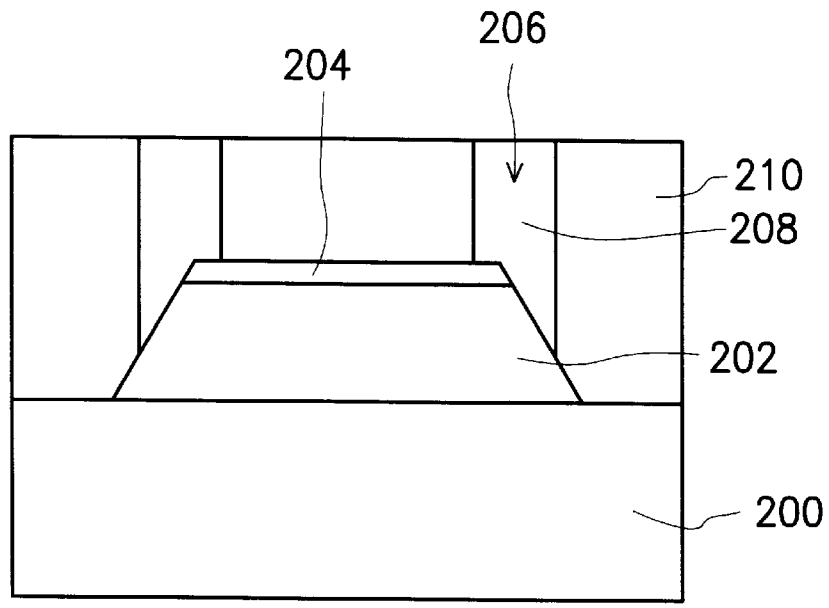
FIG. 2 is a schematic cross-sectional view of an actual borderless via structure illustrating the effect of microloading after a metallic layer is patterned to form a metallic line.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
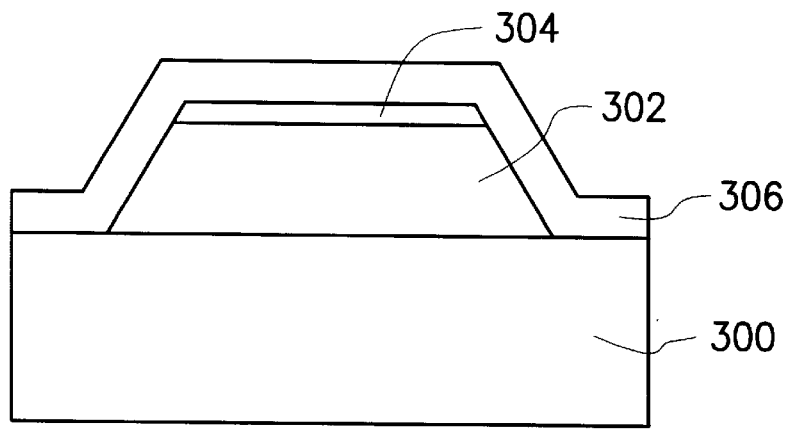
FIGS. 3A through 3C are schematic cross-sectional views showing the progression of steps according to this invention for producing a borderless via structure capable of avoiding the effect of microloading during a metal line patterning operation.
Figure 3B:
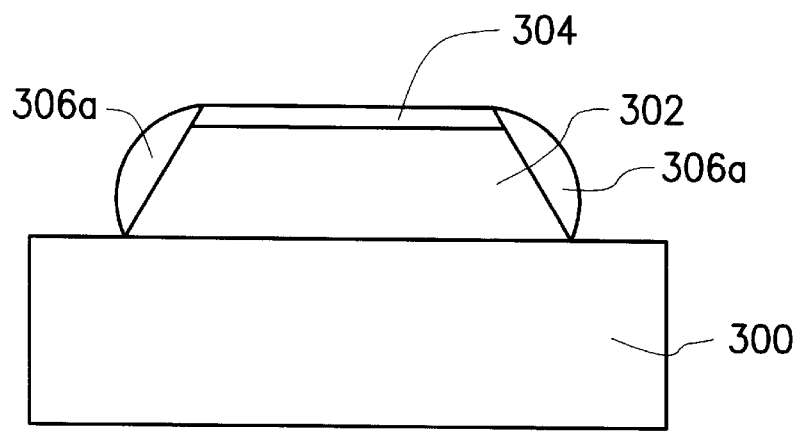
Figure 3C:
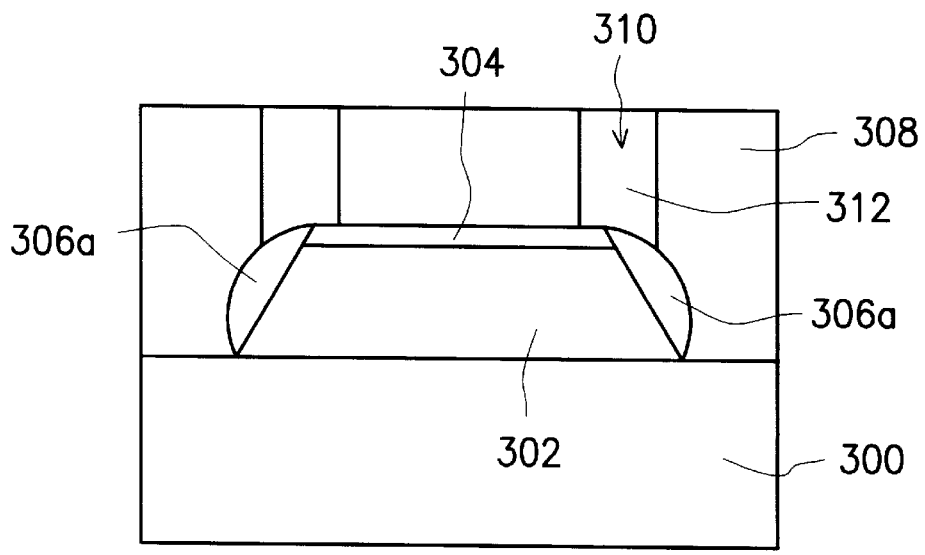

FIGS. 3A through 3C are schematic cross-sectional views showing the progression of steps according to this invention for producing a borderless via structure capable of avoiding the effect of microloading during a metal line patterning operation.

First, as shown in FIG. 3A, a stacked structure comprising a metal line 302 and a barrier layer 304 is formed over a substrate 300. The stacked structure is formed by, for example, performing photolithographic and etching processes. The metal line can be a layer of aluminum-copper alloy while the barrier layer 304 can be a layer of titanium nitride, for example. Because microloading may occur during etching, the stacked structure has a trapezoidal profile with each side having a sloped sidewall.

A barrier layer 306 is next formed over the stacked structure and the substrate 300. The barrier layer 306 having a thickness of about 400 angstroms to about 800 angstrom can be a titanium nitride layer formed by, for example, sputtering. Since the titanium nitride layer is formed by sputtering instead of going through a nitridation procedure, no aluminum nitride is formed even if the aluminum-copper metal line 302 is exposed.

As shown in FIG. 3B, the barrier layer 306 is etched back to form spacers 306a covering the sidewall of the metal line 302 as well as the barrier layer 304.

As shown in FIG. 3C, a dielectric layer 308 is formed over the metal line 302, the barrier layer 304, the spacers 306a and the substrate 300. The dielectric layer 308 can be a silicon oxide layer formed by, for example, chemical vapor deposition (CVD).

The dielectric layer 308 is planarized. Photolithographic and etching processes are carried out to form a via 310 in the dielectric layer 308. The via 310 exposes a portion of the barrier layer 304 and the spacer 306a. A plug 312 is formed inside the via 310. The plug 312 can be formed by, for example, depositing a layer of glue material and a layer of conductive material (not shown) over the dielectric layer 308 and into the via 310. The glue layer and the conductive layer above the dielectric layer 308 are removed by planarization.

The trapezoidal sidewalls of the metal line 302 and the barrier layer 304 are covered by the spacers 306a. Hence, the via 310 is shielded from the underlying metal line 302 and barrier layer 304. Therefore, even if the via is formed according to borderless design specifications and does not land directly on the barrier layer 304, surface of the metal line 302 still is not exposed by the via 310. Consequently, the plug 312 inside the via 310 has no direct contact with the metal line 302 and cannot result in a higher resistivity and electron migration.

In summary, spacers capable of serving as a barrier are formed on the sloped sidewalls of the stacked structure before vias and plugs are formed.

Since the sloped sidewalls of the metallic line and the barrier layer are covered by spacers, the via is isolated from the underlying metallic lines and barrier layer. Even if the via is formed according to borderless design specifications and does not land directly on the barrier layer, the via still does not expose the surface of the metal line. Therefore, subsequently formed plug inside the via does not make direct contact with the metal line and cannot result in a higher resistivity and electron migration.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a via, comprising the steps of:
   forming a stacked structure over a substrate, wherein the stacked structure comprises a first barrier layer over a metal line;
   forming a second barrier layer over the stacked structure and the substrate;
   etching back the second barrier layer to form spacers on sidewalls of the stacked structure;
   forming a dielectric layer over the stacked structure, the spacers and the substrate; and
   forming a via in the dielectric layer.

2. The method of claim 1, wherein a material for forming the metal line includes an aluminum-copper alloy.

3. The method of claim 1, wherein first barrier layer includes a titanium nitride layer.

4. The method of claim 1, wherein the second barrier layer includes a titanium itride layer.

5. The method of claim 1, wherein the step of forming the second barrier layer includes sputtering.

6. The method of claim 1, wherein the via is formed according to borderless design specifications.

7. A method of forming a via, comprising the steps of:
   providing a substrate;
   forming a stacked structure over the substrate, wherein the stacked structure includes a first barrier layer over a metal line formed using an aluminum-copper alloy, and the stacked structure has sloped sidewalls;
   forming a second barrier layer over the stacked structure and the substrate by sputtering;
   etching back the second barrier layer to form spacers on the sidewalls of the stacked structure;
   forming a dielectric layer over the stacked structure, the spacers and the substrate; and
   forming a via in the dielectric layer according to borderless design specification such that the via exposes a portion of the first barrier layer and a portion of the sidewall spacer.

8. The method of claim 7, wherein the first barrier layer includes a titanium nitride layer.

9. The method of claim 7, wherein the second barrier layer includes a titanium nitride layer.

* * * * *

UNITED STATES PATENT AND TRADEMARK OFFICE
CERTIFICATE OF CORRECTION

PATENT NO. : 6,245,667 B1
DATED : June 12, 2001
INVENTOR(S) : Ling-Sung Wang et al.

It is certified that error appears in the above-identified patent and that said Letters Patent is hereby corrected as shown below:

<u>Title page,</u>
Item [73], Assignee, "Semiconductor Manufacturing Corp." should read:
-- Taiwan Semiconductor Manufacturing Corp. --.

Signed and Sealed this

Fourteenth Day of January, 2003

JAMES E. ROGAN
*Director of the United States Patent and Trademark Office*